(12) United States Patent
Sturkovich et al.

(10) Patent No.: US 9,407,271 B2
(45) Date of Patent: Aug. 2, 2016

(54) MIMO LO SHARING IN MICROWAVE POINT-TO-POINT SYSTEMS

(71) Applicant: BROADCOM CORPORATION, Irvine, CA (US)

(72) Inventors: Yaacov Sturkovich, Netanya (IL); Igal Yehuda Kushnir, Azur (IL)

(73) Assignee: BROADCOM CORPORATION, Irvine, CA (US)

( * ) Notice: Subject to any disclaimer, the term of this patent is extended or adjusted under 35 U.S.C. 154(b) by 325 days.

(21) Appl. No.: 14/012,239

(22) Filed: Aug. 28, 2013

(65) Prior Publication Data

US 2015/0036562 A1 Feb. 5, 2015

Related U.S. Application Data

(60) Provisional application No. 61/860,860, filed on Jul. 31, 2013.

(51) Int. Cl.
*H04B 7/00* (2006.01)
*H03L 7/06* (2006.01)
*H04B 7/04* (2006.01)
*H04W 56/00* (2009.01)

(52) U.S. Cl.
CPC ............... *H03L 7/06* (2013.01); *H04B 7/0413* (2013.01); *H04W 56/00* (2013.01)

(58) Field of Classification Search
None
See application file for complete search history.

(56) References Cited

U.S. PATENT DOCUMENTS

| 2001/0048715 | A1* | 12/2001 | Lee ........................ | H03H 11/22 375/219 |
| 2008/0186878 | A1* | 8/2008 | Zheng ................. | H04W 88/085 370/254 |
| 2009/0180466 | A1* | 7/2009 | Soul ......................... | H03J 7/04 370/350 |
| 2009/0185650 | A1* | 7/2009 | Ravid ................... | H04B 7/0617 375/376 |
| 2010/0272163 | A1* | 10/2010 | Prager ................. | F24F 11/0086 375/220 |
| 2014/0092807 | A1* | 4/2014 | Zhao ..................... | H04W 56/00 370/328 |

* cited by examiner

*Primary Examiner* — Kevin C Harper
(74) *Attorney, Agent, or Firm* — Garlick & Markison; Randy W. Lacasse

(57) ABSTRACT

A method and system is provided for sharing of bandwidth on intermediate frequency cabling connections between indoor and outdoor units of a MIMO microwave communications system. Phase locked loop design assists in creating synchronization signals to be transmitted over the cable connecting the indoor units and outdoor units.

20 Claims, 6 Drawing Sheets

MIMO LO SHARING IN MICROWAVE POINT-TO-POINT SYSTEMS

CROSS REFERENCE TO RELATED PATENTS/PATENT APPLICATIONS

The present U.S. Utility Patent Application claims priority pursuant to 35 U.S.C. §119(e) to the following U.S. Provisional Patent Application Ser. No. 61/860,860, entitled, "MIMO Microwave Point-to-Point Systems," filed Jul. 31, 2013, pending, which is hereby incorporated herein by reference in its entirety and made part of the present U.S. Utility Patent Application for all purposes.

BACKGROUND

1. Technical Field

The present disclosure described herein relates generally to microwave communications systems and more particularly to a MIMO (multiple-in, multiple-out) microwave point-to-point (P2P) communications network.

2. Description of Related Art

Depending on the type of wireless communication system, a wireless communication device, such as a cellular telephone, two-way radio, personal digital assistant (PDA), personal computer (PC), laptop computer, home entertainment equipment and other equivalents communicate directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s).

Microwave technology is frequently used for point-to-point communications. Microwaves are especially suitable for this use since they are more easily focused into narrow beams than radio waves, have comparatively higher frequencies which allow broad bandwidth and high data flow, and also may have smaller antennas.

DETAILED DESCRIPTION

Point-to-point communication networks provide for direct wireless data communications via radio frequencies (RF) or optical means (i.e., lasers). One element of P2P communication networks is that the transmission medium uses line of sight between the transmitter(s) and the receiver(s) of the members of the P2P network.

Recently, due to increasing bandwidth and data requirements, P2P communication networks have evolved to use microwaves. Microwaves are radio waves with wavelengths ranging from as long as one meter to as short as one millimeter, or equivalently, with frequencies between 300 MHz (0.3 GHz) and 300+ GHz. This broad definition includes both UHF (ultra-high frequency) and EHF (extremely-high frequency), and various sources use different boundaries. In all cases, microwave includes at least the entire SHF (super high frequency) band (e.g., 3 to 30 GHz, or 10 to 1 cm) at minimum, with RF engineering often putting the lower boundary at 1 GHz (30 cm), and the upper around 100 GHz (3 mm).

Figure 1:
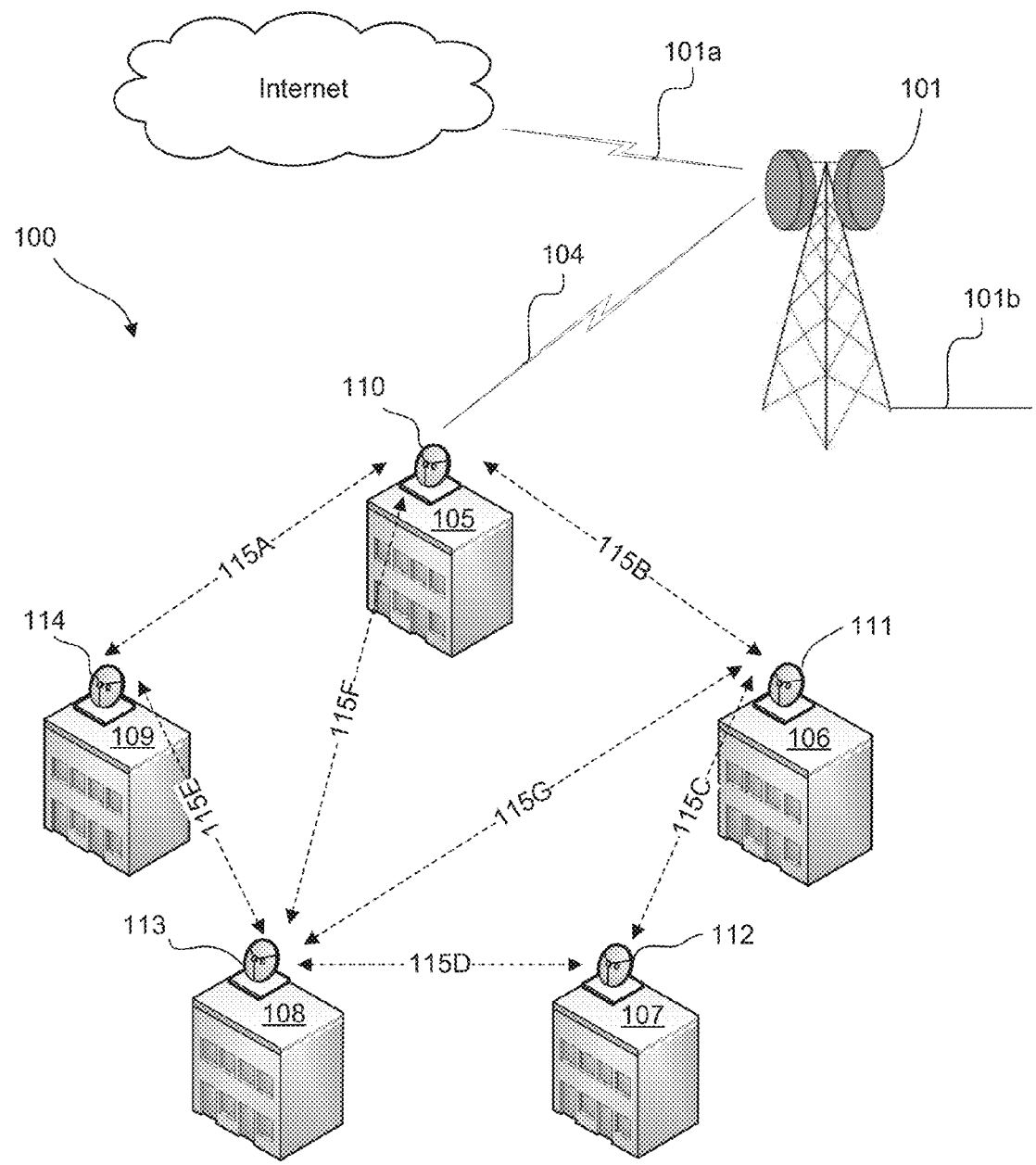
FIG. 1 is a microwave point-to-point communications network illustrating one embodiment in accordance with the present disclosure.

FIG. 1 is a microwave point-to-point communications network illustrating one embodiment in accordance with the present disclosure. As shown, a P2P network is established between node 110 (building 105) and nodes 111, 112, 113 and 114 (buildings 106, 107, 108 and 109, respectively). In the P2P network, each node communicates directly with other members of the P2P network.

Node 110, in communication with node 101, shares connection resources with nodes 111-114 through P2P connections 115A through 115G. Although connections 115A through 115G are shown, each node of the P2P network is capable of communication connections with any other node in the P2P network. Point-to-point communications network 100 is, in one embodiment, wirelessly connected to node 101, such as a microwave tower which includes at least a microwave communications transceiver for communicating data to/from (104) point-to-point node 110 as well as to/from (101a) a remote communications network in connection with an ISP for providing an Internet source. In one embodiment, node 101 simply acts as a relay for communication signals 104. In another embodiment, node 101 (e.g., E-UTRAN Node B (eNB)) includes a base station to support communications to/from the tower (101a and 104). In yet another embodiment, any of the nodes (101, 110-114) includes a wired connection 101b (e.g., fiber optic, cable, telephone) to a remote communications network (not shown) in connection with an ISP for providing an Internet source.

As the cellular capacity continues to increase, the microwave backhaul needs to keep up with the demands. For example, high modulations of 4096QAM (quadrature amplitude modulation) are using cross polarization of the signal waveform to increase capacities and are currently being installed with future capacity demands driving the evolution of microwave technology to include cross polarization and use of multiple antennas (i.e., MIMO) that have an even greater impact on capacities.

Figure 2:
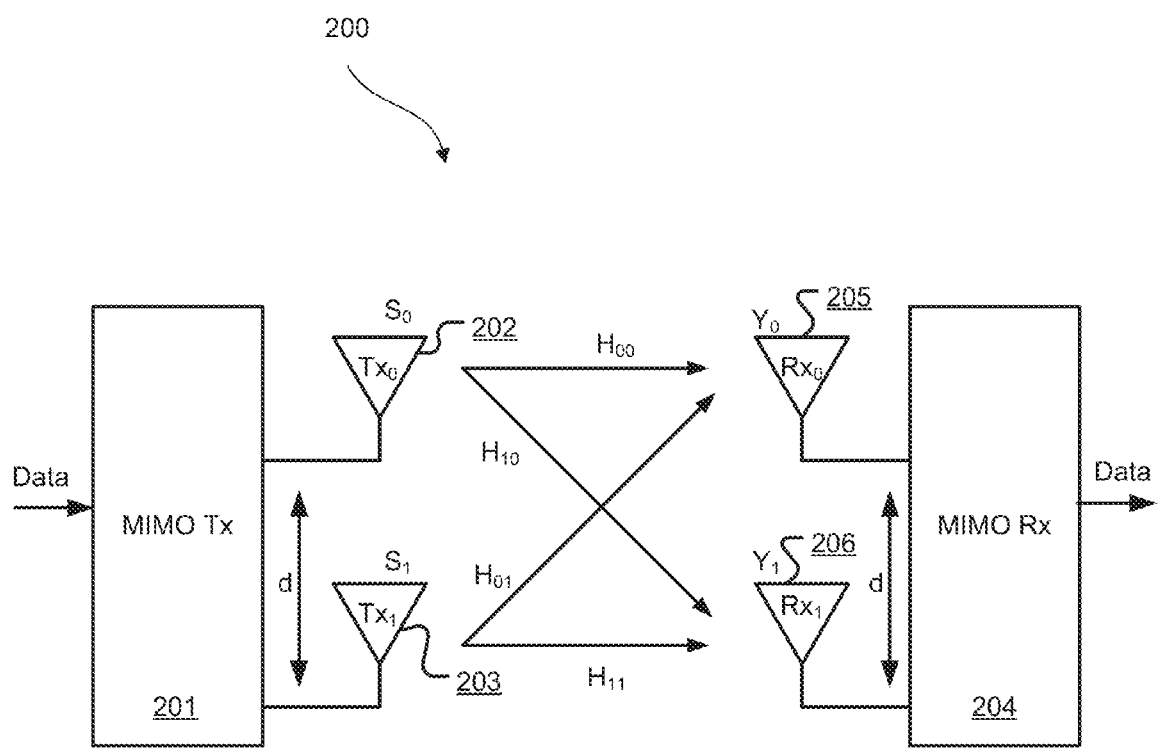
FIG. 2 is a diagram illustrating a simple two antenna MIMO scheme in accordance with the present disclosure.

FIG. 2 is a diagram illustrating a simple two antenna MIMO scheme in accordance with the present disclosure. Unlike non-line of sight applications (e.g., cellular networks), MIMO P2P networks are geometrical and require accurate spacing between antennas for frequency-division duplexing (FDD) to transmit and receive signals simultaneously on different channels (e.g., in the millimeter wave (MMW) radio frequency band). As shown, the MIMO structure 200 includes a transmitting (Tx) unit 201 having two antennas 202 and 203, while a receiving (Rx) unit 204 is shown having two antennas 205 and 206. It is to be noted that both transmitting unit 201 and receiving unit 204 are generally both transceivers, but are shown as separate Tx and Rx units for an exemplary purpose in FIG. 2. That is, Tx unit 201 is transmitting data and Rx unit 204 is receiving the transmitted data. The transmitted data symbols at antennas 202 ($Tx_0$), 203 ($Tx_1$) are noted as $S_0$ and $S_1$, respectively. The received data symbols at antennas 205 ($Rx_0$) and 206 ($Rx_1$) are noted as $Y_0$ and $Y_1$, respectively. Since the example illustrates a two transmit antenna/two receive antenna MIMO system, the four resulting RF signal paths are noted as $H_{00}$, $H_{01}$, $H_{10}$, and $H_{11}$ (using an $H_{Tx\text{-}Rx}$ notation) and the data path is referred to as channel H. While, the example illustrated is a two antenna MIMO structure, the embodiments disclosed herein may operate within other known and future multi-antenna configurations (e.g., 2×4, 2×8, 4×16, etc.)

Referring again to FIG. 2, antennas 202 and 203 are separated by distance (d) based on the frequencies being transmitted and received. The distance separating the antennas, for example in microwave applications, varies between several meters to few tens of meters in typical installations.

Figure 3:
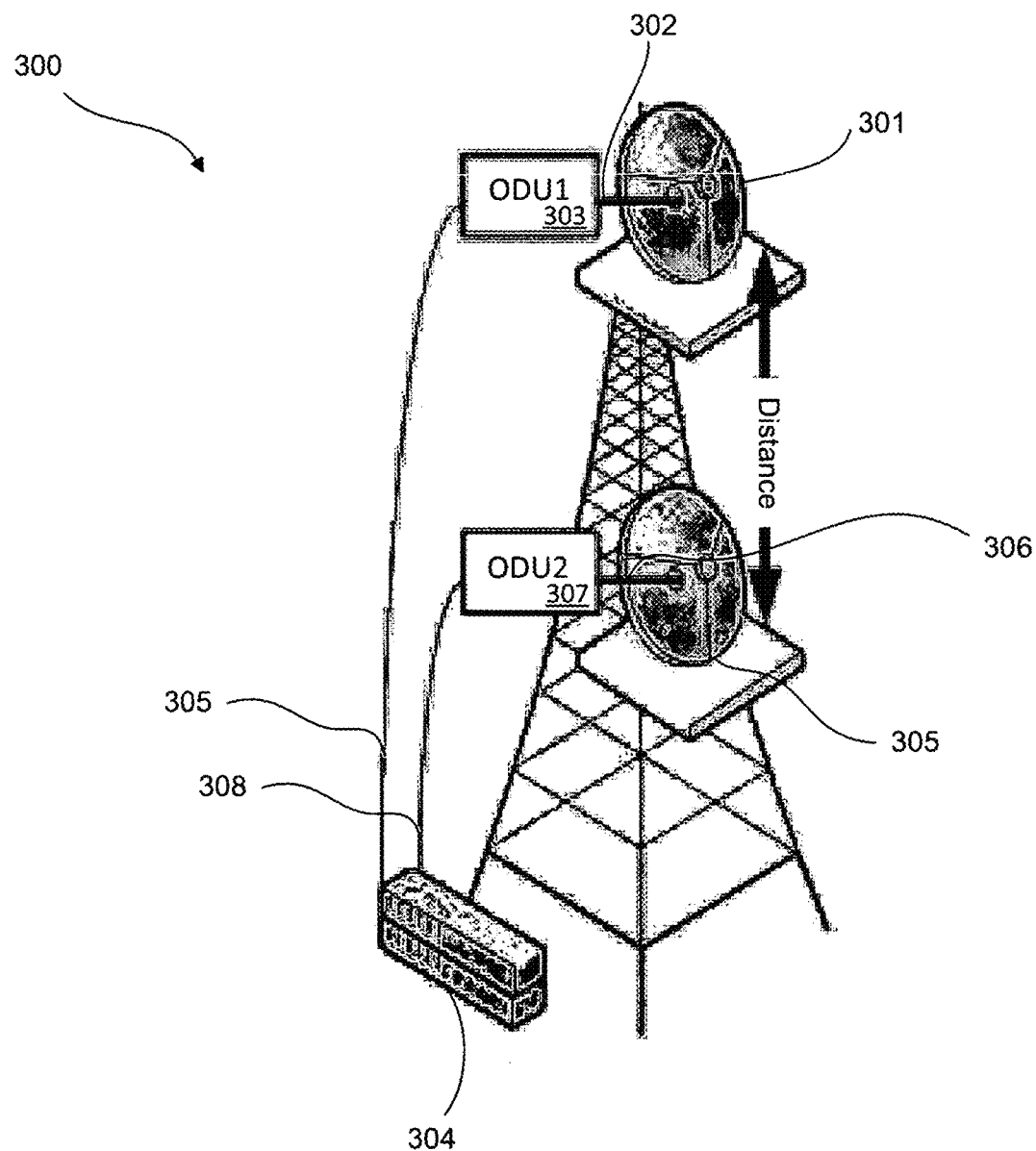
FIG. 3 illustrates a general microwave MIMO communications tower in accordance with the present disclosure.

In one embodiment, the MIMO P2P is implemented in a high-QAM, microwave communications system. FIG. 3 illustrates a general MIMO microwave communications tower in accordance with the present disclosure. MIMO Microwave communications tower 300 includes first microwave antenna 301 connected to outdoor unit (ODU) 303 by high frequency cable 302. ODU 303 is also connected to indoor unit (IDU) 304 through intermediate frequency (IF) cable 305. A second microwave antenna 305, separated by a distance (d) from first microwave antenna 301, is connected by high frequency cable 306 to ODU 307 that is also connected to IDU 304 through intermediate frequency (IF) cable 308. IDU units in one or more embodiments are described as one unit; however multiple IDUs communicatively connected are within the scope of the technology described herein.

In one embodiment, ODUs 303 and 307 are located in close proximity to the corresponding antennas and are connected to their corresponding antennas by high frequency cables. The ODUs house the local oscillators (LO) that are used to produce high-QAM microwave signals. QAM is an analog and digital modulation scheme conveying two analog signals (or digital bit streams) using amplitude-shift keying (ASK) to modulate the amplitudes of the two signal waves. The two sinusoidal signal waves are typically out of phase with each other by 90 degrees and referred to as quadrature components. The modulated signals waves are combined to form a waveform. A local oscillator (LO) is an electronic oscillator used to generate a signal to convert a communications signal of interest to a different frequency using a mixer as is known in the communications art.

One of the many factors effecting MIMO performance is differential phase noise (interference) between the multiple transmitters and multiple receivers that make up a typical MIMO P2P network. This issue is exacerbated by the application of microwave frequencies (operating, for example, at up to 43 GHz) to the MIMO P2P network making it disadvantageous to put multiple transmitters and multiple receivers into the same outdoor unit (ODU). For microwave MIMO applications, putting multiple transmitters and multiple receivers into the same ODU box would typically require very expensive high frequency long cables from the ODU box to the antennas. In addition, these cables would result in decreased output power and cause significant signal loss.

In one example embodiment, to reduce noise, distance is created between the multiple transmitters and multiple receivers by using two ODUs, one placed at or near each antenna (antennas separated by distance d). Synchronization of local oscillators in each of the two ODUs is beneficial to high quality communications. However, connecting the two local oscillators with a high frequency cable is not cost effective.

In one embodiment in accordance with the present disclosure, a method and system is provided for a MIMO microwave P2P communications network to share low frequencies of the connection (IF cable) between the indoor unit and the outdoor units to synchronize LOs of the two ODUs.

Figure 4:
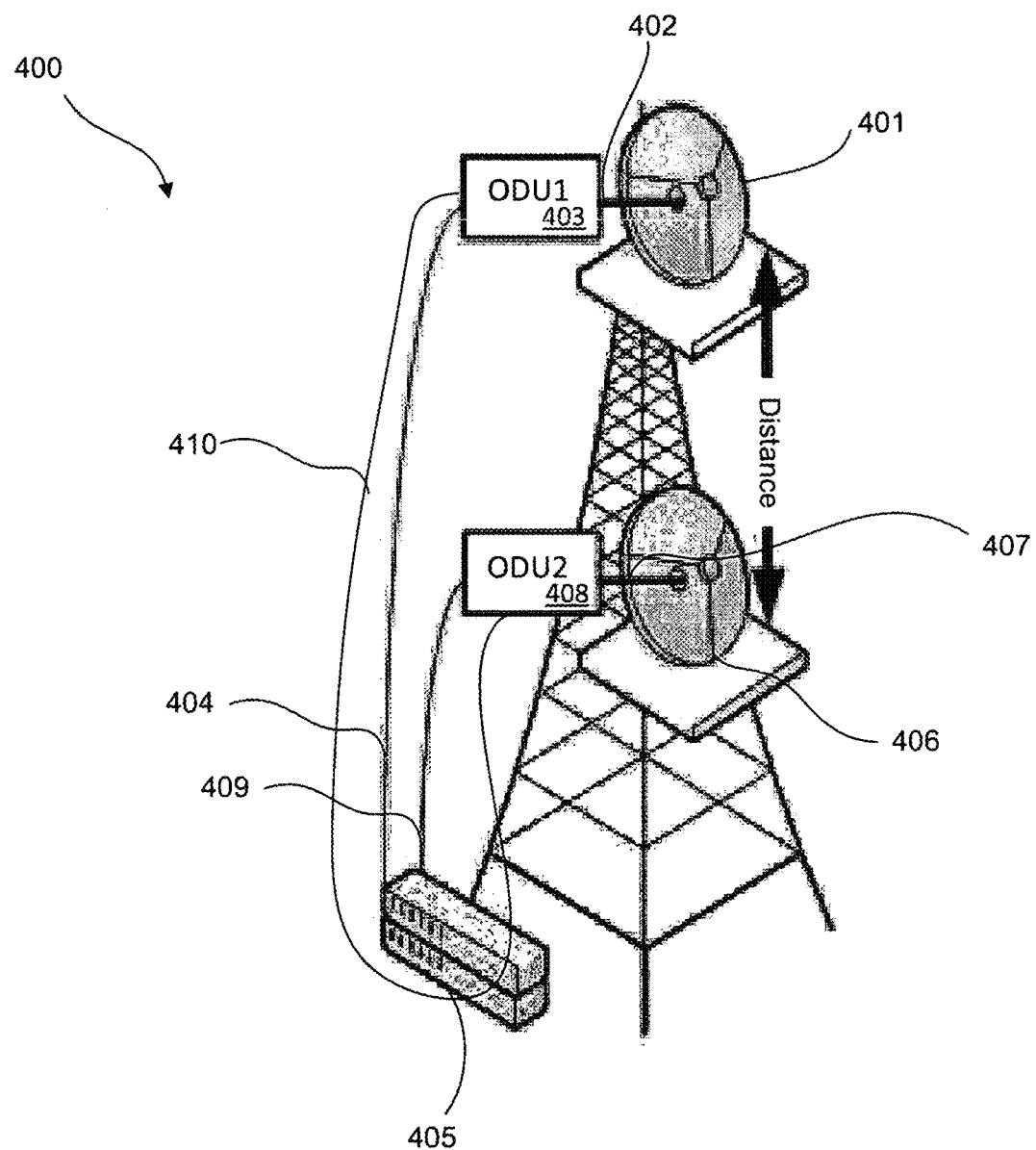
FIG. 4 illustrates an example embodiment of a microwave MIMO communications tower in accordance with the present disclosure.

FIG. 4 illustrates an example embodiment of a MIMO microwave communications tower in accordance with the present disclosure. MIMO Microwave communications tower 400 provides for a first microwave antenna 401 connected by high frequency cable 402 to ODU 403. ODU 403 is connected to IDU 405 by IF cable 404. A second microwave antenna 406, separated by a distance (d) from microwave antenna 401, is connected by high frequency cable 407 to ODU 408. ODU 408 is connected to IDU 405 through IF cable 409. Synchronization signals for the local oscillators located in ODUs 403 and 408 are sent over the IF cables connecting ODUs 403 and 408 (shown as a separate cable 410 for illustration purposes only). In one embodiment, a phase locked loop (PLL) is included to facilitate sharing of low frequency bandwidth available on IF cables 404 and 409. In one example embodiment, IF cables 404 and 409 include frequencies lower than 700 MHz.

Figure 5:
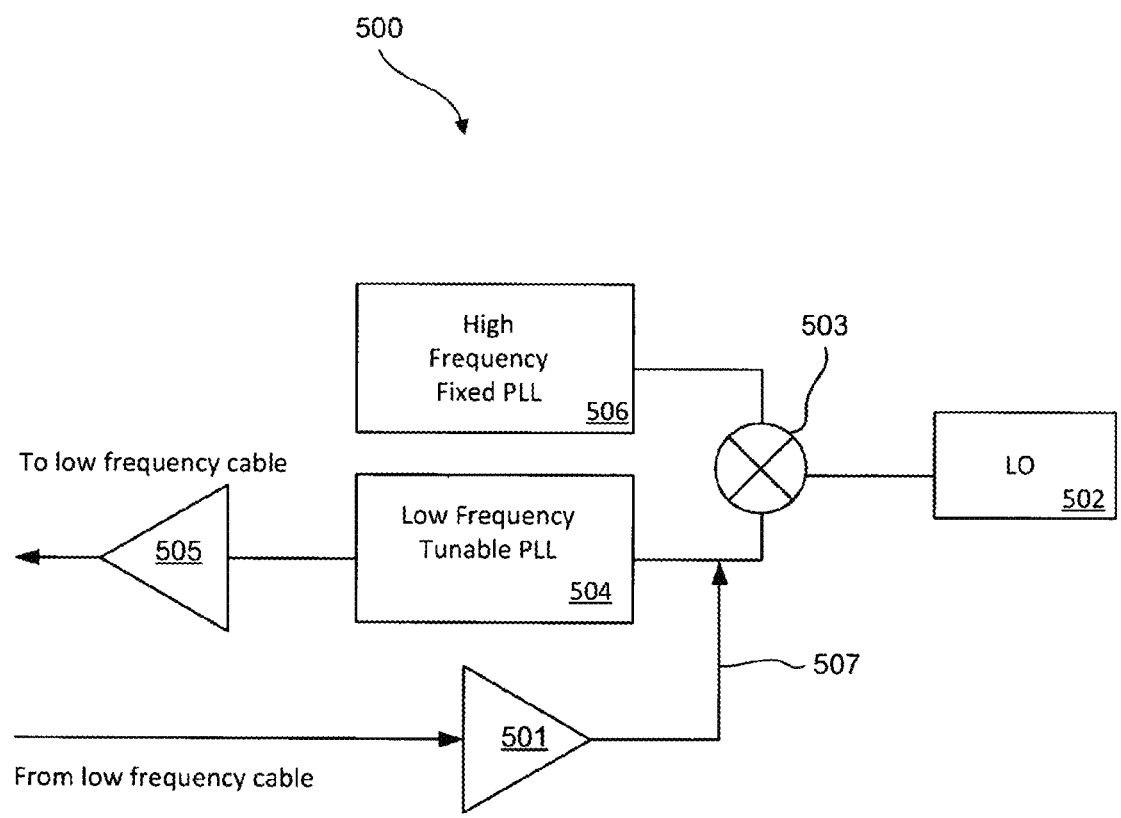
FIG. 5 illustrates a schematic diagram for a phase locked loop in accordance with the present disclosure.

FIG. 5 illustrates a schematic diagram for a phase locked loop in accordance with the present disclosure. As previously described, ODUs 403 and 408 are connected together through IF cables 404 and 409 for synchronization of the local oscillators. In this embodiment, one or more phase-locked loop circuits are used in each ODU to lock the phase and provide adjustments to each ODU's local oscillator to thereby maintain synchronization between them. A phase-locked loop or phase lock loop (PLL) is a circuit that generates an output signal using a phase detector that compares the phase of input signal with the phase of the input periodic signal and adjusts the oscillator to keep the phases matched. Phase-locked loop system 500 includes a high frequency fixed phase-locked loop circuit 506 in conjunction with a low frequency tunable phase-locked loop 504. In addition, signals transmitted onto and received from the IF cables include amplification through amplifiers 505 and 501, respectively. A reference signal is generated by local oscillator 502, and fed through mixer 503 to both high frequency fixed phase-locked loop circuit 506 and low frequency tunable PLL 504. Synchronization signals from another ODU are fed back 507 into the low frequency tunable PLL 504 to correct for phase errors. The tunability of low frequency tunable PLL 504 provides lower phase noise.

Superposition of the low frequency tunable PLL and the high frequency PLL allows good phase noise and tuning range. Since low frequency PLL is the major contributor to the total phase noise, it is of high enough quality by itself to synchronize between the two ODUs.

Figure 6:
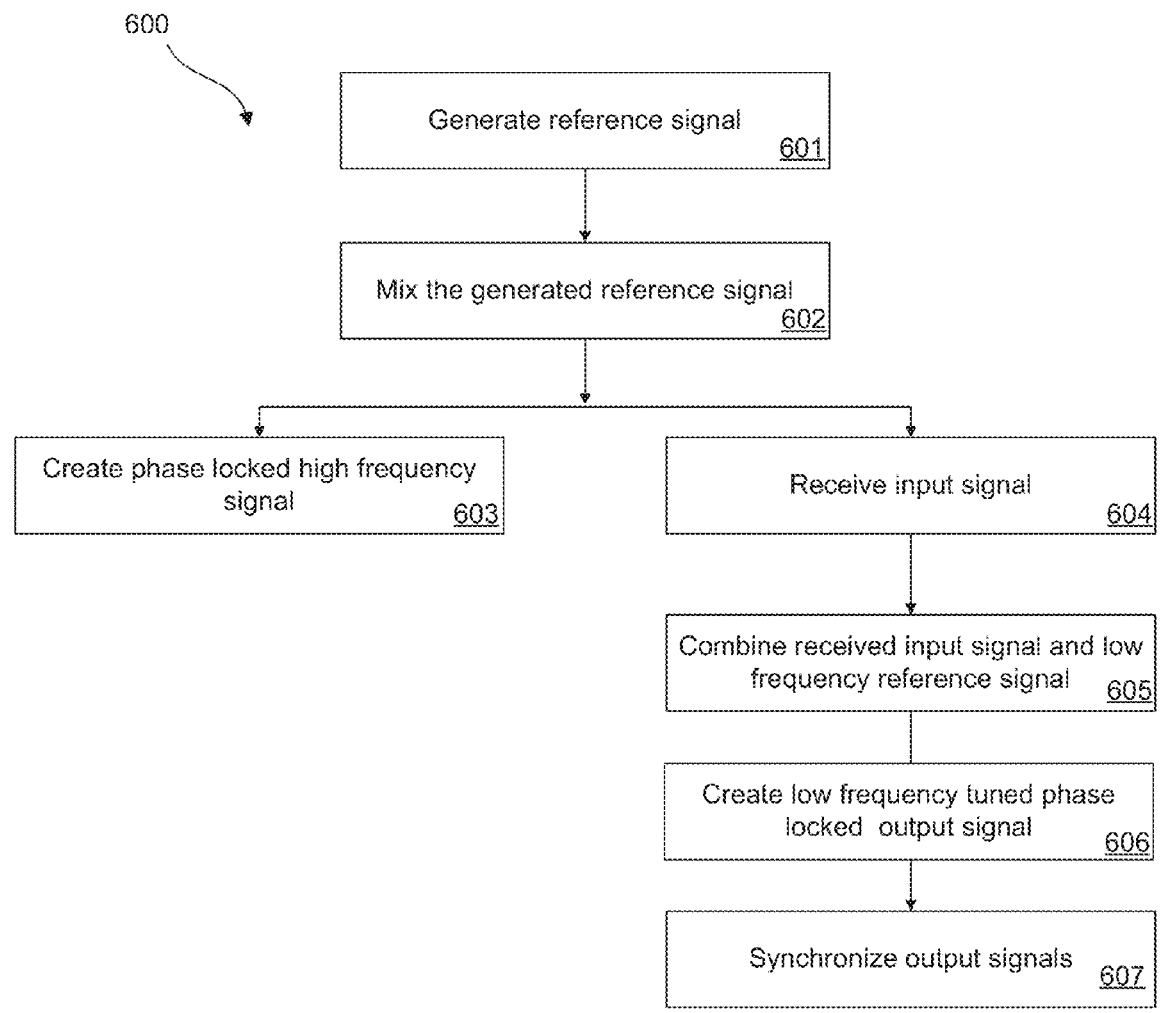
FIG. 6 illustrates a flowchart for synchronization of the outdoor units in accordance with the present disclosure.

FIG. 6 illustrates a flowchart for synchronization of the outdoor units in accordance with the present disclosure. Synchronization process 600 begins by generating a reference signal by the local oscillators within each of the outdoor units in step 601. The reference signal is mixed by the mixer and split into a high frequency reference signal component and a low frequency reference signal at step 602. The outdoor units of the MIMO microwave P2P communications network are connected to the microwave antennas through high frequency cables. The high frequency reference signal component is passed as an input to a fixed high frequency phase locked loop for communication with the microwave antennas in step 603. In step 604, an input signal (i.e., LO synchronization signal) is received by an outdoor unit from its corresponding indoor unit as received from another ODU. The input signal is combined with the low frequency reference signal and passed to the low frequency tunable phase locked loop in step 605. The low frequency tunable phase locked loop produces a tuned phase locked output signal in step 606. The output signal is transmitted over the IF cables to the other ODU (also with a PLL) to synchronize the local oscillators in step 607. Throughout the specification, drawings and claims various terminology is used to describe the one or more embodiments. As may also be used herein, the terms "signals" and "communications signals" are considered equivalent. As may also be used herein, the terms "processing module", "processing circuit", "processor" and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed technology described herein. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed technology described herein. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A microwave MIMO (multiple-input, multiple-output) communications system comprising:
    a first microwave antenna for transmitting/receiving first communication signals;
    a first outdoor unit coupled to the first microwave antenna;
    an indoor unit with a first connection to the first outdoor unit;
    a second microwave antenna for transmitting/receiving second communication signals;
    a second outdoor unit coupled to the second microwave antenna and further connected to the indoor unit over a second connection; and
    wherein the first connection and second connection carry synchronization signals between the first and second outdoor units to synchronize local oscillators located within the first and second outdoor units.

2. The system according to claim 1, wherein the first outdoor unit and the second outdoor unit further comprising one or more phase locked loops coupled to the local oscillators to provide adjustments to the local oscillators.

3. The system according to claim 2, wherein the one or more phase locked loops comprise a fixed high frequency fixed phase locked loop and a tunable low frequency phase locked loop.

4. The system according to claim 3, wherein the tunable low frequency phase locked loop processes the synchronization signals as feedback for the tunable low frequency phase locked loop.

5. The system according to claim 1, wherein the first and second connections are on intermediate frequency (IF) cables and the first and second microwave antennas use millimeter wave (MMW) signaling.

6. The system according to claim 1, wherein the microwave MIMO (multiple-input, multiple-output) communications system is part of a microwave MIMO point-to-point communications network.

7. The system according to of claim 6, wherein the microwave MIMO point-to-point communications network is operable for frequency-division duplexing (FDD).

8. A microwave MIMO (multiple-input, multiple-output) communications system comprising:
- a first microwave antenna for transmitting/receiving first communication signals;
- a first outdoor unit connected to the first microwave antenna, the first outdoor unit including at least a first local oscillator;
- a second microwave antenna for transmitting/receiving second communication signals;
- a second outdoor unit connected to the second microwave antenna, the second outdoor unit including at least a second local oscillator;
- intermediate frequency (IF) connection cabling interconnecting the first and second outdoor units to at least one indoor unit; and
- the first and second outdoor units, further include a phase locked loop comprising:
- one of the first or second local oscillators for generating a reference signal;
- a mixer for converting the generated reference signal;
- a high frequency fixed phase locked loop for generating a high frequency signal having a fixed phase;
- a low frequency tunable phase locked loop for generating an output signal; and
- a first power amplifier for communicating the output signal across the intermediate frequency (IF) connection cabling; and
- a second power amplifier for amplification of a feedback signal received over the intermediate frequency connection cabling to adjust phase of the one of the first or second local oscillators; and
- wherein the first and second local oscillators located within the first and second outdoor units are synchronized by transmission of synchronization signals for the first and second local oscillators between the first and second outdoor units over the IF connection cabling.

9. The microwave MIMO communications system according to claim 8, wherein the intermediate frequency (IF) connection cabling comprises allocated bandwidth to the synchronization signals.

10. The microwave MIMO communications system according to claim 8, wherein the first and second outdoor units are part of a microwave point-to-point communication system.

11. The microwave MIMO communications system according to claim 8, wherein the first and second outdoor units are part of a MIMO microwave point-to-point communication system.

12. A method of synchronizing local oscillators of a MIMO microwave communications network, comprising:
- generating a low frequency tuned reference signal within at least a first and second outdoor unit separated by a distance d;
- transmitting the generated low frequency tuned reference signal across shared intermediate frequency cable connections between the first and second outdoor units, the shared intermediate frequency cable connections including at least a first intermediate frequency connection between the first outdoor unit and its corresponding indoor unit and at least a second intermediate frequency connection between the second outdoor unit and its corresponding indoor unit;
- receiving at the first and second outdoor units the transmitted low frequency tuned reference signal; and
- feeding the received low frequency tuned reference signal into a tunable phase locked loop for synchronizing the local oscillators.

13. The method according to claim 12, further comprising the first and second outdoor units communicating high frequency communication signals to microwave antennas.

14. The method according to claim 13, wherein the high frequency communication signals are communicated over high frequency cables to the microwave antennas.

15. The method according to claim 12, wherein the shared intermediate frequency cable connections are shared with one or more indoor unit communication signals.

16. The method according to claim 12, wherein the MIMO microwave communications network is part of a microwave point-to-point communication system comprising millimeter wave (MMW) signaling.

17. The method according to claim 12, wherein the MIMO microwave communications network is part of a MIMO microwave point-to-point communication system.

18. The method according to claim 12, wherein the MIMO microwave communications network is operable for frequency-division duplexing (FDD).

19. The microwave MIMO communications system according to claim 8, wherein the intermediate frequency cable connections are shared with one or more indoor unit communication signals.

20. A microwave MIMO (multiple-input, multiple-output) communications system according to claim 1 further comprising one or more phase locked loops comprising a fixed high frequency fixed phase locked loop and a tunable low frequency phase locked loop and the tunable low frequency phase locked loop processing the synchronization signals as feedback for the tunable low frequency phase locked loop.

* * * * *